(12) United States Patent
Ohta et al.

(10) Patent No.: US 6,740,814 B2
(45) Date of Patent: May 25, 2004

(54) WIRING CONNECTION METHOD AND WIRING CONNECTION STRUCTURE

(75) Inventors: Takashi Ohta, Kobe (JP); Hiroshi Moriguchi, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 0 days.

(21) Appl. No.: 10/164,376

(22) Filed: Jun. 10, 2002

(65) Prior Publication Data

US 2002/0189840 A1 Dec. 19, 2002

(30) Foreign Application Priority Data

Jun. 13, 2001 (JP) ......................................... 2001-178433

(51) Int. Cl.$^7$ ................................................. H02G 1/00
(52) U.S. Cl. ....................... 174/68.1; 174/72 R; 174/50; 439/76.2
(58) Field of Search .................. 174/68.1, 50, 68.2, 174/70 B, 71 B, 72 B, 88 B, 99 B, 129 B, 149 B, 52.1, 59, 65 R, 52.2, 60, 72 R; 439/212, 76.1, 76.2, 979, 65, 74; 361/611, 648; 220/3.2, 3.8, 4.02

(56) References Cited

U.S. PATENT DOCUMENTS

| | | | | |
|---|---|---|---|---|
| 4,867,696 A | * | 9/1989 | Demler et al. ............ | 174/72 B |
| 6,023,022 A | * | 2/2000 | Nakamura et al. ......... | 174/88 R |
| 6,220,874 B1 | * | 4/2001 | Kurata et al. .............. | 439/76.2 |
| 6,322,400 B1 | * | 11/2001 | Perry et al. ................. | 439/212 |
| 6,325,640 B1 | * | 12/2001 | Kasai ......................... | 439/76.2 |
| 6,376,773 B1 | * | 4/2002 | Maegawa ................. | 174/88 R |
| 6,444,910 B1 | * | 9/2002 | Goto ......................... | 174/70 B |
| 6,464,538 B2 | * | 10/2002 | Miyazaki et al. .......... | 439/610 |
| 6,503,090 B2 | * | 1/2003 | Onizuka ..................... | 439/75 |
| 6,560,115 B1 | * | 5/2003 | Wakabayashi et al. ..... | 174/52.2 |

FOREIGN PATENT DOCUMENTS

| | | |
|---|---|---|
| JP | A 8-227738 | 9/1996 |
| JP | A 9-83154 | 3/1997 |
| JP | A 2000-323848 | 11/2000 |

* cited by examiner

Primary Examiner—Anthony Dinkins
Assistant Examiner—Angel R. Estrada
(74) Attorney, Agent, or Firm—Oliff & Berridge, PLC

(57) ABSTRACT

A wiring connection method includes the steps of connecting a bus bar for wiring inside an electronic apparatus and a harness for leading out wiring to outside, placing the bus bar and the harness connected together on a notch portion of a housing, and filling a resin to fix the harness in the notch portion of the housing.

7 Claims, 7 Drawing Sheets

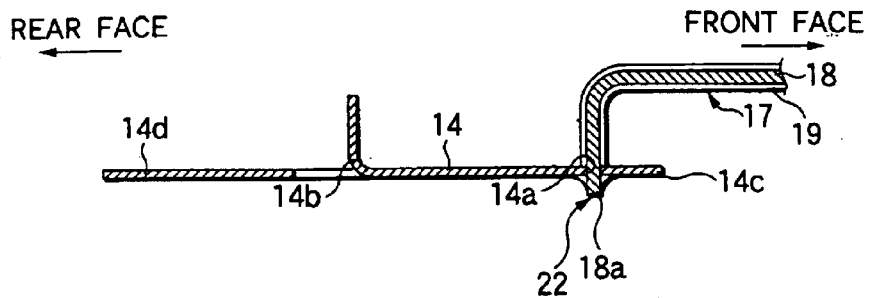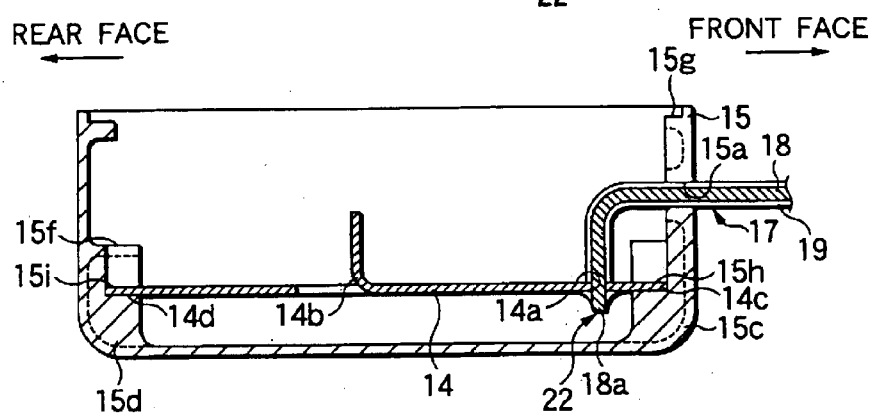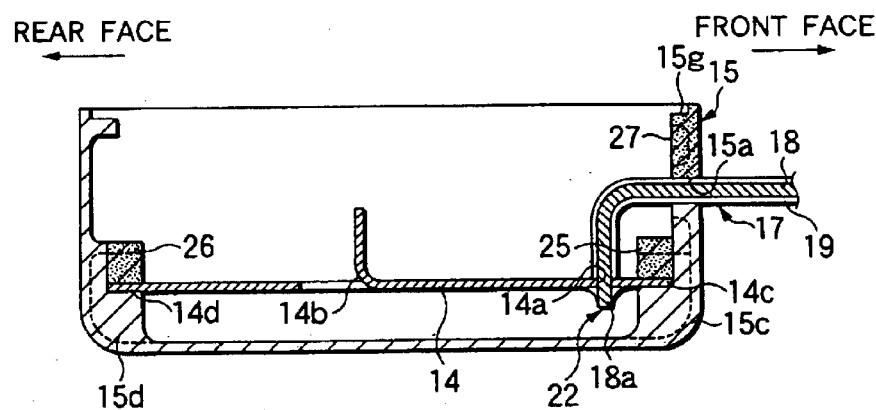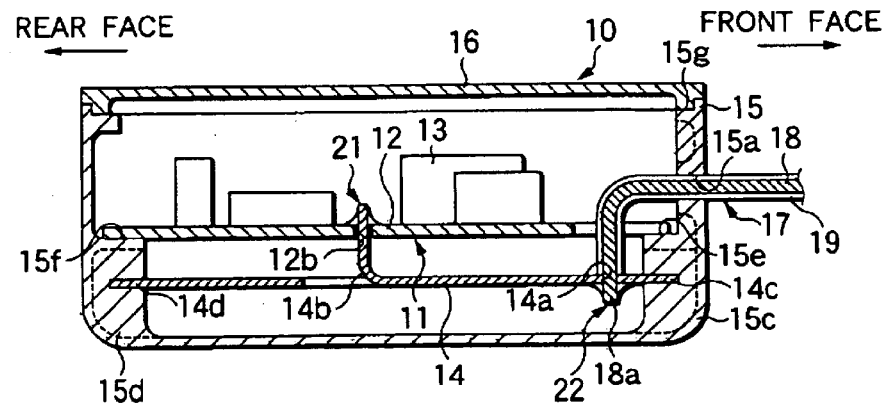

WIRING CONNECTION METHOD AND WIRING CONNECTION STRUCTURE

The present disclosure relates to the subject matter contained in Japanese Patent Application No.2001-178433 filed on Jun. 13, 2001, which is incorporated herein by reference in its entirety.

BACKGROUND OF THE INVENTION

1. Field of the Invention

The present invention relates to a wiring connection method for leading out wiring of an electric circuit inside an electronic apparatus to the outside, and more particularly to a wiring connection method and structure for a power wiring connection to which a large current is applied.

2. Description of the Related Art

FIG. 7 is an appearance view showing a wiring connection structure according to the related art for making wiring of an electronic apparatus to the outside. FIG. 8 is a cross-sectional view showing the wiring connection structure according to the related art for making the wiring of the electronic apparatus to the outside, taken along the line A-A' in FIG. 7.

Generally, the wiring connection method and structure according to the related art for leading out the electric circuit wiring inside the electronic apparatus to the outside, particularly the power wiring connection method and structure in which a large current is applied is constructed so that a bus bar 4 and a connector pin 7 are insert molded in a housing 5 for the electronic apparatus and the bus bar 4 is connected via the soldered connector pin 7 to the outside, as shown in FIGS. 7 and 8.

As shown in FIGS. 7 and 8, in a wiring connection structure 70 according to the related art for leading out wiring in the electronic apparatus to the outside, the bus bar 4 and the connector pin 7 are insert molded in the case 5 molded of a resin material for the electric circuit. The bus bar 4 is made of a metal material such as copper useful to supply a large current. The connector pin 7 is made of metal material such as copper and formed in L shape to lead out the electric circuit wiring to the outside. An electric circuit substrate portion 1 having electronic parts packaged on a printed board 2 (referred to as a board 2) is mounted within the housing 5, in which the connector pin 7 and the bus bar 4, and the bus bar 4 and the land on the board 2 are soldered, respectively.

In this wiring connection, the wiring for the electric circuit substrate portion 1 composed of electric circuits including a control circuit is connected via the bus bar 4 and the connector pin 7 to a power supply wiring such as an external battery (connected to a connector 9a) and a load wiring (connected to a connector 9b) by means of a connector 8 for outside connection. Within this housing 5, the electric circuit substrate portion 1 is mounted and after wiring connection, a lid 6 molded of resin material is put on the housing 5, whereby the electronic apparatus is assembled.

The housing 5 is molded of resin material like a box, and has the bus bar 4 and the connector pin 7 insert molded. The electric circuit substrate portion 1 is mounted within the housing 5.

Projection ribs 5c and 5d are provided on the inner faces of a front frame portion and a rear frame portion for this housing 5, respectively. End portions 4c and 4d of the bus bar 4 are insert molded into the projection ribs 5c and 5d.

The electric circuit substrate portion 1 is mounted on the upper faces 5e and 5f of the projection ribs 5c and 5d.

A projection portion 5a having a concave portion 5b with an opening at one end to insert the connector 8 for outside connection is provided on an outer surface of the front frame portion for the housing 5. The connector pin 7 is insert molded into a bottom wall 5h of this concave portion 5b. A rib 5g for being attached the lid 6 made of resin material to is molded on an upper face portion with an opening in the housing 5. The connector 8 for outside connection is inserted into the concave portion 5b of the projection portion 5a into which the connector pin 7 for this housing 5 is insert molded. The electric circuit wiring including a control circuit in the electric circuit substrate portion 1 mounted within the housing 5 is connected via the connector pin 7 to the power source supply wiring connector 9a for the external battery and the load wiring connector 9b by means of the connector 8 for outside connection.

The bus bar 4 has the terminals 4a, 4b formed by punching and bending a part of the bus bar 4 at positions spaced apart a predetermined distance from one end of the front face side toward the rear face side (e.g., a junction position with the connector pin 7, and a junction position with a land of the board 2), the terminals 4a and 4b being formed of a metal material such as copper like a plate. This bus bar 4 has the end portions 4c and 4d insert molded into the projection ribs 5c and 5d provided on the front frame portion and the rear frame portion of the housing 5, respectively. This bus bar 4 connects the power supply wiring via the connector pin 7 to the land on the board 2 by soldering the terminal 4a of the bus bar 4 with a junction portion 71 of the connector pin 7 and soldering the terminal 4b of the bus bar 4 with a junction portion 72 of the board 2, after the electric circuit substrate portion 1 is mounted within the housing 5.

In the above wiring connection method and structure for leading out the wiring inside the electronic apparatus to the outside, particularly the power wiring connection method and structure in which a large current is applied, it is required to solder the bus bar and the connector pin provided within the housing of the electronic apparatus and to solder the board and the bus bar. The soldering must be performed after the bus bar, the connector pin, and the board are accommodated within the housing, and takes a lot of trouble. Also, the connector is used for wiring connection, resulting in increase of costs.

SUMMARY OF THE INVENTION

The present invention has been achieved to solve the above-mentioned problems. It is an object of the invention to provide a wiring connection method and a wiring connection structure in which the wiring connection can be made in a smaller number of steps, and the costs can be reduced.

In order to accomplish the above object, a first aspect of the invention provides a wiring connection method having the steps of connecting a bus bar for wiring inside an electronic apparatus and a harness for leading out wiring to outside, placing the bus bar and the harness connected together on a notch portion of a housing, and filling a resin to fix the harness in the notch portion of the housing.

A second aspect of the invention provides the wiring connecting method according to the first aspect, in which in the placing step, a connection portion between the bus bar and the harness is placed in a portion to be filled with the resin.

A third aspect of the invention provides the wiring connecting method according to claim 1, in which in the filling step, a connection portion between the bus bar and the harness is covered with the resin.

A fourth aspect of the invention provides the wiring connecting method according to the second aspect, further having the steps of disposing a heat sink to contact with a portion filled with the resin.

A fifth aspect of the invention provides the wiring connecting method according to the first aspect, further having the steps of soldering the bus bar with an electric circuit board.

A sixth aspect of the invention provides a wiring connection method having the steps of connecting a bus bar for wiring inside an electronic apparatus and a harness for leading out wiring to outside, placing the bus bar and the harness on a notch portion of a housing so that a connecting portion between the bus bar and the harness is exposed outside the housing, filling a resin to fix the bus bar in the notch portion of the housing to insert-mold the bus bar into the housing, and covering the connection portion between the bus bar and the harness exposed from the housing with a thermal conductive resin.

A seventh aspect of the invention provides a wiring connection method having the steps of placing a bus bar on a notch portion of a housing so that a top end portion of the bus bar for wiring inside an electronic apparatus is exposed outside the housing, filling a resin to fix the bus bar in the notch portion of the housing to insert-mold the bus bar into the housing, connecting a harness with the bus bar at the outside of the housing, and covering a connection portion between the bus bar and the harness exposed from the housing with a thermal conductive resin. The placing step is conducted prior to the connecting step.

An eighth aspect of the invention provides a wiring connection method for an electronic apparatus containing electronic parts requiring large current for driving, the method having the steps of integrally molding a harness for wiring inside the electronic apparatus and leading out wiring to outside of a housing with the housing at a time of molding the housing.

A ninth aspect of the invention provides the wiring connection method according to the eighth aspect, further having the steps of placing the harness on a notch portion of the housing.

A tenth aspect of the invention provides a wiring connection structure for an electronic apparatus containing electronic parts requiring large current for driving, the structure having a housing and a harness for wiring inside the electronic apparatus and leading out wiring to outside of the housing. The harness is molded integrally with a housing.

An eleventh aspect of the invention provides the wiring connection structure according to the tenth aspect, in which a notch portion is formed in the housing, the harness passes through the notch portion from outside of the housing to inside thereof, and the harness has core wiring covered with a jacket.

BRIEF DESCRIPTION OF THE DRAWINGS

FIG. 3 is an explanatory cross-sectional view showing the steps of a wiring connection method for connecting the wiring of the electronic apparatus to the outside according to the first embodiment of the invention.

DETAILED DESCRIPTION OF THE PREFERRED EMBODIMENTS

The preferred embodiments of the present invention will be described below with reference to the accompanying drawings.

Figure 1:
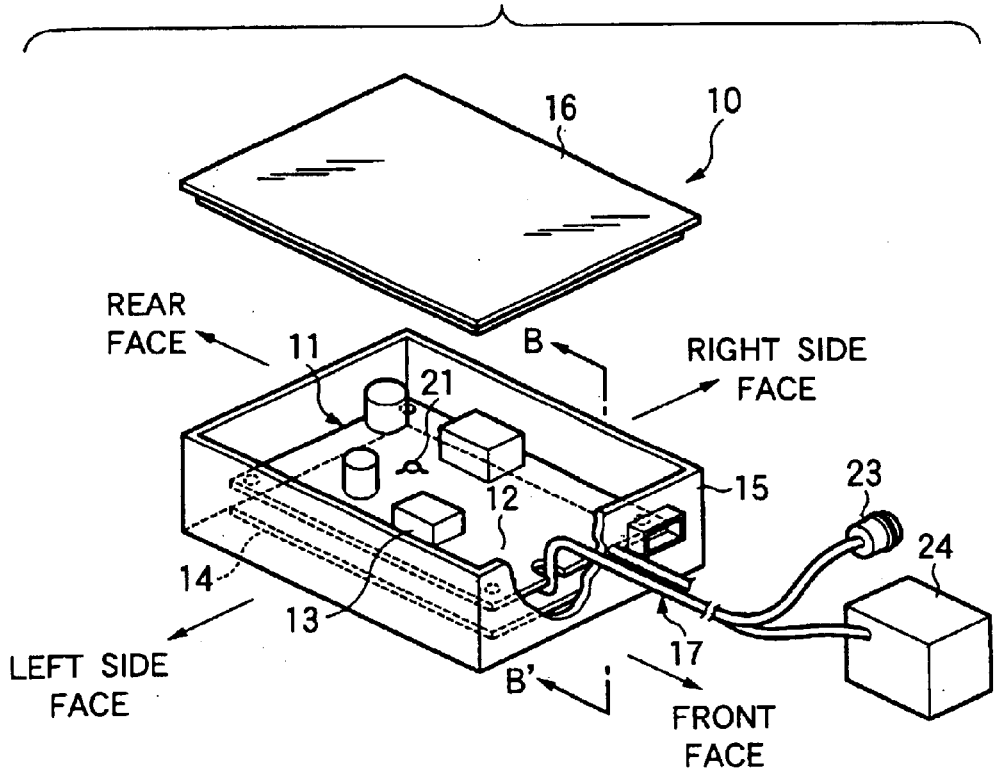
FIG. 1 is an appearance view showing a wiring connection structure for connecting wiring of an electronic apparatus to the outside according to a first embodiment of the present invention.
Figure 2:
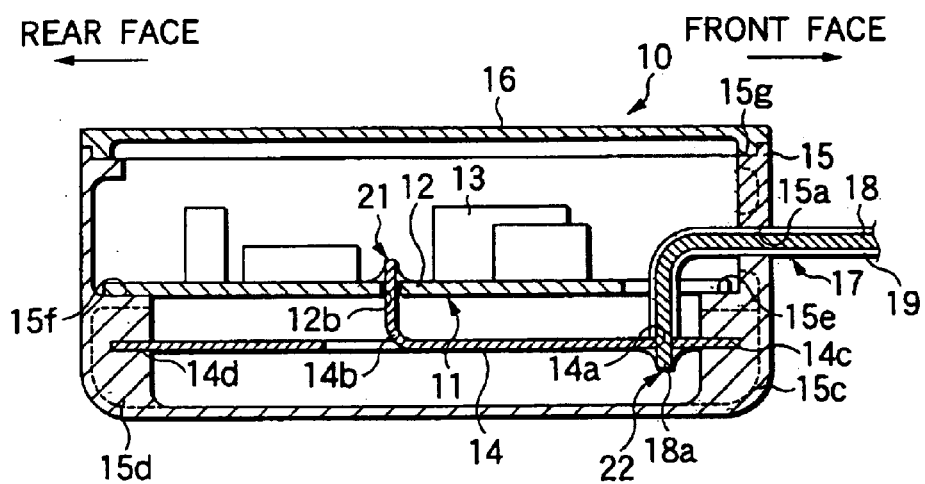
FIG. 2 is a cross-sectional view showing a wiring connection method for connecting the wiring of the electronic apparatus to the outside according to the first embodiment of the invention, taken along line B-B' in FIG. 1.

FIG. 1 is an appearance view showing a wiring connection structure for connecting wiring of an electronic apparatus to the outside according to a first embodiment of the present invention. FIG. 2 is a cross-sectional view showing a wiring connection method for connecting the wiring of the electronic apparatus to the outside according to the first embodiment of the invention, taken along line B-B' in FIG. 1. Through the first to third embodiments, the same parts are designated by the same or like numerals and description for these parts is given mainly in the first embodiment and is omitted in other embodiments.

As shown in FIG. 1 and FIG. 2, the wiring connection structure 10 for connecting the electronic apparatus to the outside according to the first embodiment of the invention, the wiring connection structure 10 is constructed so that a bus bar 14 and a harness 17 for outside connection are insert-molded into a housing 15 while the bus bar 14 and the harness 17 are jointed. The bus bar 14 is made of a metal material such as copper used to supply a large current. The harness 17 for outside connection is formed of a metal wire rod such as copper wire having a jacket made of an insulating material. The housing 15 is formed of a resin material for the electronic apparatus. An electric circuit substrate portion 11 having the electronic parts 13 packaged on a printed board 12 (simply referred to as aboard 12) is mounted in this housing 15. The bus bar 14 is soldered to the land of the board 12 to wire. Whereby, the wiring of the electric circuit substrate portion 11 having electric circuits including a control circuit is directly connected via the harness 17 for outside connection joined with the bus bar 14 insert molded into the housing 15 to a power supply wiring portion 23 such as an external battery (e.g., connected to a connector or a terminal portion of the battery) and a load wiring portion 24 (e.g., a wiring portion on the board making up a load circuit or a load circuit connector) without using of any connector. After the electric circuit substrate portion 11 is mounted in the housing 15 and is wired and connected to the bus bar 14 insert-molded into the housing 15, the housing 15 is covered with a lid 16 formed of a resin material. Whereby the electronic apparatus of tightly closed structure is assembled.

The housing 15 is formed of resin material such as ABS resin like a box, in which the bus bar 14 and the harness 17 for outside connection formed of a metal wire rod such as copper wire having a jacket made of an insulating material, the harness 17 welded with the bus bar 14 are insert molded into the housing 15. The electric circuit substrate portion 11 is mounted in the housing 15. The projection ribs 15c and 15d are provided on the inner faces of a front frame portion and a rear frame portion of this housing 15, respectively. The end portions 14c and 14d of the bus bar 14 are insert molded into the projection ribs 15c and 15d, respectively. The harness 17 for outside connection having a jacket 19 made of insulating material and a core wire 18 such as copper wire, the harness 17 welded with the bus bar 14 is disposed in an attaching hole 15a provided on the front frame portion of the housing 15. The harness 17 is insert molded into the housing 15 in a state where the harness 17 is joined with and connected to the bus bar 14.

The projection ribs 15c and 15d of this housing 15 are provided with the planar portions 15e and 15f for mounting the electric circuit substrate portion 11. A rib 15g for mounting the lid 16 made of a resin material or the like is molded on an upper face portion with opening in the housing 15.

After the electric circuit substrate portion 11 is mounted within the housing 15, the land of the board 12 is soldered with the bus bar 14. Whereby, the electric circuit wiring of the electric circuit substrate portion 11 having electric circuits including a control circuit is directly connected via the bus bar 14 and the harness 17 for outside connection to the power supply wiring portion 23 such as an external battery (e.g., connected to a connector or a terminal portion of the battery) and the load wiring portion 24 (e.g., a wiring portion on the board making up a load circuit or a load circuit connector).

Regarding insert molding the harness 17 for outside connection into the housing 15, in the case where the housing 15 is made of ABS material, which is a resin material for low temperatures (e.g., 100° C.), the harness 17 for outside connection is disposed into the attaching hole 15a on the front frame portion for the housing 15 and is insert molded in a state where the jacket 19 of insulating material covers the core wire 18 such as copper wire. Also, in the case where the housing 15 is made of TBS material, which is a resin material for high temperatures (e.g., 220° C.) or PPS material (e.g., 300° C.), the harness 17 for outside connection is disposed into the attaching hole 15a on the front frame portion for the housing 15 and is insert molded in a state where a heat resisting taut tube 19 is put on the jacket 19 of insulating material, which covers the core wire 18 such as copper wire. When the ABS material is used, the above molding method may be used.

The bus bar 14 is formed with a bore 14a for inserting and welding the core wire 18 of the harness 17 for outside connection at a position spaced apart a predetermined distance from one end of the front face side toward the rear face side. The bus bar 14 also has a terminal 14b, which is formed by punching and bending a part of the bus bar 14 at a position opposite to the land of the board 12. The bus bar 14 is made of a metal material such as copper and shaped like a plate. This bus bar 14 has the end portions 14c and 14d insert molded into the projection ribs 15c and 15d provided on the front frame portion and the rear frame portion of the housing 15, respectively. After the electric circuit substrate portion 11 is mounted in the housing 15, the terminal 14b of the bus bar 14 is inserted into a bore 12b having the land of the board 12, and a connection portion 21 of the terminal 14b and the land of the board 12 are soldered, whereby the power supply wiring and the like are connected via the harness 17 for outside connection and the bus bar 14 to the land of the board 12.

The harness 17 for outside connection has the core wire 18 such as copper wire covered with the jacket 19 of insulating material. The harness 17 connects the wiring of the electric circuit substrate portion 11 composed of electric circuits including a control circuit via the bus bar 14 to the power supply wiring portion 23 such as an external battery and the load wiring portion 24. The harness 17 is used to supply a large current. This harness 17 for outside connection is welded beforehand with the bus bar 14, whereby the electric circuit wiring of the electric circuit substrate portion 11 are connected via the bus bar 14 to the external battery without using the connector. Hence, a current loss due to the connector can be prevented when supplying large current.

Referring to FIG. 3, a procedure for the wiring connection method of the wiring connection structure 10 for connecting the electronic apparatus to the outside will be described below.

FIG. 3 is an explanatory cross-sectional view showing the steps of the wiring connection method for connecting the wiring of the electronic apparatus to the outside according to the first embodiment of the invention. FIG. 3A shows a step of welding the bus bar and the harness. FIG. 3B shows a step of placing the bus bar in the housing in a state where the bus bar and the harness are welded. FIG. 3C shows a step of insert molding the bus bar and the harness into the housing by filling resin in the housing. FIG. 3D shows a step of mounting the electric circuit substrate portion in the housing and soldering the bus bar with the circuit pattern of the electric circuit substrate portion.

In the step of welding the bus bar 14 and the harness 17, several harnesses 17 for outside connection having a predetermined length (e.g., length from a position of the bus bar 14 provided in the electric circuit substrate portion 11 including the control circuit to a position of the power supply wiring portion 23 such as an external battery, or to a position of the load wiring portion 24) are connected with the bus bar by ultrasonic welding or resistance welding, as shown in FIG. 3A. In this welding, the jacket 19 is removed by predetermined length and the core wire 18 of the harness 17 for outside connection is inserted into the bore 14a provided in the bus bar 14 to project from a surface of the bus bar 14, and then the bus bar 14 and the core wire 18a are welded at a projection portion 22 of this core wire 18.

In the step of placing the bus bar 14 in the housing in a state where the bus bar 14 and the harness 17 are joined, the bus bar 14 and the harness 17 welded are placed in the housing 15, as shown in FIG. 3B. This is performed by placing the end portion 14d of the bus bar 14 in a notch portion 15i of the projection rib 15d provided in the rear frame portion of the housing 15, placing the front end portion 14c of the bus bar 14 in a notch portion 15h of the projection rib 15c provided in the front frame portion of the housing 15, and placing the harness 17 for outside connection in the attaching hole 15a in the front frame portion of the housing 15 in a state where the jacket 19 covers the core wire 18.

Next, in the step of insert molding the bus bar 14 and the harness 17 into the housing 15 by filling resin into the housing, the bus bar 14 and the harness 17 are insert molded into the housing 15 by filling resin in a placement portion of the housing 15 where the bus bar 14 and the harness 17 are disposed, as shown in FIG. 3C. This is performed by filling a resin material 26 in the end portion 14d of the bus bar 14 disposed in the notch portion 15i of the projection rib 15d provided in the rear frame portion of the housing 15, filling a resin material 25 in the end portion 14c of the bus bar 14 disposed in the notch portion 15h of the projection rib 15c provided in the front frame portion of the housing 15, and filling a resin material 27 in the harness 17 for outside connection disposed in the attaching hole 15a in the front frame portion of the housing 15.

Lastly, in the step of mounting the electric circuit substrate portion 11 in the housing 15 and soldering the bus bar 14 with the circuit pattern of the electric circuit substrate portion 11, the electric circuit substrate portion 11 is mounted on the upper faces 15e and 15f of the projection ribs 15c and 15d in the housing 15 having the bus bar 14 and the harness 17 for outside connection insert molded, as shown in FIG. 3D.

At the time of mounting the electric circuit substrate portion 11 in the housing 15, the end portion 14b of the bus bar 14 is inserted into the bore 12b having the land of the board 12, and the electric circuit substrate portion 11 is attached on the housing 15, using an attaching screw (not shown) The projection portion 21 at the terminal 14b of the bus bar 14 inserted into the bore 12b of the board 12 having the land and the land of the board 12 are soldered. This step of soldering the terminal 14b of the bus bar 14 and the land of the board 12 may be made at the time of joining the bus bar 14 and the harness 17 for outside connection before placingthe bus bar 14 and the harness 17 for outside connection in the housing 15.

An electronic apparatus of sealed structure, for example, is assembled by putting the lid 16 on the housing 15 in which the electric circuit substrate portion 11 is mounted. The harness 17 for outside connection disposed in this electronic apparatus is connected to the power supply wiring portion 23 such as an external battery (e.g., connected to a connector 23 or a terminal portion of the battery) and the load wiring portion 24 (e.g., a wiring portion on the board making up a load circuit or a load circuit connector).

As described above, in the wiring connection method and wiring connection structure 10 for connecting the electronic apparatus to the outside according to the first embodiment of this invention, the bus bar 14 used to supply a large current and the harness 17 for outside connection are welded before they are accommodated within the housing 15, and insert molded into the housing 15 for the electronic apparatus in a state where they are joined. Whereby, the wiring of the electric circuit substrate portion 11 having electric circuits including a control circuit, which is soldered to the bus bar 14, to the outside can be directly connected via the harness 17 for outside connection to the power supply wiring portion 23 such as an external battery and the load wiring portion 24 without using any connector. Hence, number of parts such as a connector can be reduced. Since the bus bar 14 and the harness 17 for outside connection are joined before being accommodated within the housing 15, number of steps for soldering the connector pin and the bus bar can be reduced. It is possible to prevent a current loss due to the connector when supplying a large current.

A wiring connection structure 30 for connecting an electronic apparatus to the outside according to a second embodiment of the invention will be described below with reference to the accompanying drawings.

Figure 4:
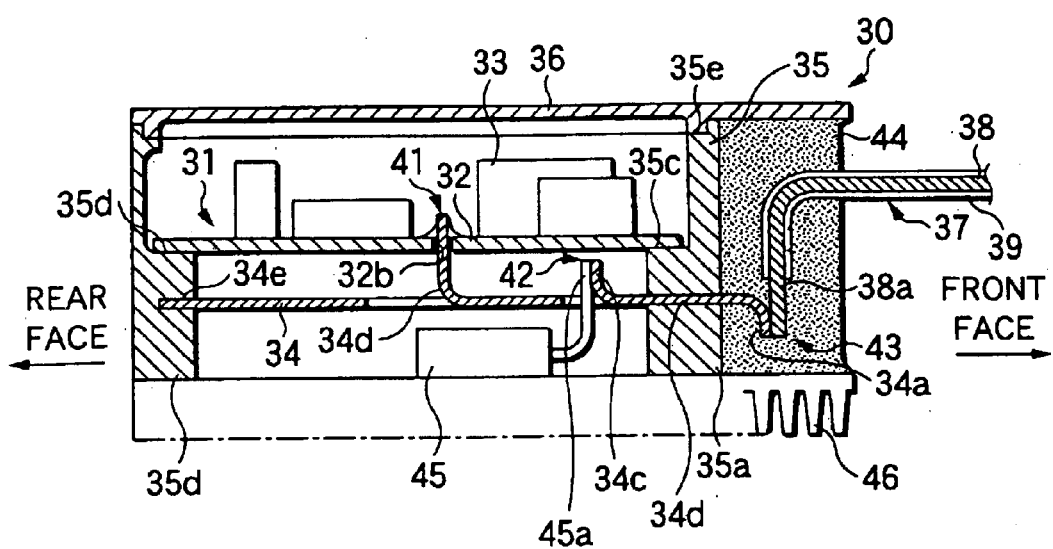
FIG. 4 is a cross-sectional view showing a wiring connection structure for connecting wiring of an electronic apparatus to the outside according to a second embodiment of the invention.

FIG. 4 is a cross-sectional view showing the wiring connection structure for connecting the wiring of the electronic apparatus to the outside according to the second embodiment of the invention.

As shown in FIG. 4, in the wiring connection structure 30 connecting for the electronic apparatus to the outside according to the second embodiment of the invention, for the first embodiment, one edge 34a of a bus bar 34 and one end 38a of a core wire 38 of a harness 37 for outside connection are welded. A welded connection portion between the one edge 34a and the end 38a protrudes from a projection rib 35a of housing 35. The bus bar 34 is made of a metal material such as copper used to supply a large current and is formed in an L shaped. The harness 37 for outside connection includes a metal wire rod such as copper wire having a jacket made of an insulating material. The bus bar 34 joined with the harness 37 for outside connection is insert molded into the housing 35. The welded connection portion between the one edge 34a of the bus bar 34 and the one end 38a of the harness 37 for outside connection is molded of a resin material 44 having a high thermal conductivity. Accordingly, only a different point from the first embodiment of the invention will be described. The different point includes the welded connection portion between the bus bar 34 and the harness for outside connection, insert molding the bus bar 34 into the housing 35, and injection molding the resin material 44 into the welded connection portion between the bus bar 34 and the harness 37 for outside connection. The description of other points is omitted.

The housing 35 is formed of resin material such as ABS, TBT or PPS resin and shaped like a box, in which the bus bar 34 with which the harness 37 for outside connection formed of a metal wire rod such as copper wire having the jacket made of an insulating material is welded is insert molded into the housing 35. On the rear face side of this housing, a heat radiating plate 46 to which the electronic parts 45 having large heat capacity are attached is installed. A lid 36 formed of resin material is attached on the upper side of the housing 35.

The projection ribs 35a and 35b are provided on the inner faces of a front frame portion and a rear frame portion of this housing 35, respectively. A portion 34d, which is apart from the one edge 34a of the bus bar 34, is disposed in the projection rib 35a in a state where the one edge 34a at a front side of the bus bar formed in the L shaped protrudes from the front frame portion of the housing 35. The other edge 34b at the rear side of the bus bar 34 is disposed in the projection rib 35 of the rear frame portion. The bus bar 34 is insert molded into the housing 35 while the one edge 34a and the other edge 34b are disposed in the above described state.

In order to mount the electric circuit substrate portion 31, planar upper face portions 35c and 35d are provided on the projection ribs 35a and 35b of the housing 35. A planar portion 5e for being attached the lid 36 formed of resin material to is molded on an upper face portion with opening in the housing 35. The heat radiating plate 46 made of a metal material having high heat conductivity is installed on the back face of the housing 35.

In the projection rib 35a side of this housing 35, the lid 36 attached on the upper face portion with opening in the housing 35 is greatly formed to protrude from the projection rib 35a and the heat radiating plate 46 installed on the back face of the housing 35 is greatly formed to protrude from the projection rib 35a. Whereby, a cavity portion is defined, which is surrounded by the projection rib 35a of the housing 35, the lid 36 and the heat radiating plate 46. The resin material 44 having high heat conductivity is poured into this cavity portion, whereby the welded connection portion between the one end 38a of the core wire 38 for the harness 37 for outside connection and the one edge 34a of the bus bar 34, disposed in the cavity portion is molded of the resin material 44.

After the electric circuit substrate portion 31 is mounted within the housing 36, a land of the board 32 is soldered with the bus bar 34, whereby the electric circuit wiring of the electric circuit substrate portion 31 having electric circuits including a control circuit are directly connected via the bus bar 34 and the harness 37 for outside connection to the power supply wiring portion (not shown) such as an external battery and the load wiring portion (not shown).

By placing the welded connection portion between the one end 38a of the core wire 38 for the harness 37 for outside connection and the one edge 34a of the bus bar 34 in the cavity portion surrounded by the projection rib 35a of the housing 35, the lid 36 and the heat radiating plate 46 and injection molding the resin material 44 having high heat conductivity, the harness 37 for outside connection welded with one edge 4a of the bus bar 34 has a stronger holding power and the heating of the welded portion due to supply of large electric power can be radiated via the resin material 44 to the heat radiating plate 46. The cavity portion into which the resin material 44 is filled may be defined by providing the projection portions on the upper and lower faces of the projection rib 35a in the housing 35 and molding the front frame portion having a U-character shape in cross section. The heat radiating plate 46 may be dispensed with depending on the degree of heating due to supply of electric power, and the frame portion on the lower face may be integrated with the housing 35. Also, the resin material 44 may not have high heat conductivity.

The cavity portion surrounded by the projection rib 35a of the housing 35, the lid 36 and the heat radiating plate 46 may not be provided depending on the degree of heating due to supply of electric power. The resin material 44 may not be filled by injection.

At one edge on the front face side, the bus bar 34 has the one edge 34a formed in the L shaped, which the core wire 38 of the harness 37 for outside connection is abutted with in advance and is welded to connect to. A terminal 34c formed by punching and bending a part of the bus bar 34 is provided at a position facing to a lead wire 45a of an electronic component 45 that is spaced a certain length from this one edge 34a to the rear face side. A terminal 34b formed by punching and bending a part of the bus bar 34 is provided at a position facing to the land of the board 32 that is spaced a certain length from this one edge 34a to the rear face side. The bus bar 34 is made of a metal material such as copper and shaped like a plate.

This bus bar 34 is disposed such that the one edge 34a of the bus bar 34 projects from the projection rib 35a of the housing 35 and the portion 34d spaced from the one edge 34a of the bus bar 34 toward the rear face side penetrate through the projection rib 35a provided in the front frame portion of the housing 35. The other end 34e of the bus bar 34 on the rear face side being disposed in the projection rib 35b provided in the rear frame portion of the housing 35. The bus bar 34 is insert molded into the housing 35 in the above described state. This bus bar 34 has the lead wire 45a of the electronic part 45 having large heat capacity soldered beforehand with the terminal 34c of the bus bar 34.

This housing 35 has the heat radiating plate 46 installed on the back face of the housing 35, and the electronic part 45 having large heat capacity soldered with the bus bar 34 is attached on the inner face of this heat radiating plate 46 and fixed by the attaching screw (not shown). After the electric circuit substrate portion 31 is mounted in the housing 35, the terminal 34b of the bus bar 34 is soldered with a joint portion 41 of the land of the board 32, and the power supply wiring is connected via the harness 37 for outside connection and the bus bar 34 to the electric circuit substrate portion 31.

The harness 37 for outside connection has a jacket 39 of insulating material covering the core wire 38 such as copper wire, and is used to make the electrical connections, namely, to connect the wiring of the electric circuit substrate portion 31 having electric circuits including a control circuit via the bus bar 34 to the power supply wiring portion (not shown) such as an external battery and the load wiring portion (not shown), to supply a large current to the electric circuit substrate portion 31. In this harness 37 for outside connection, the core wire portion 38a from which the jacket 39 is removed at one end of the harness 37 by a predetermined length is welded beforehand with the one edge 34a of the bus bar 34 formed in the L shaped. The bus bar 37 is bent at a position spaced a certain distance from the welded connection portion to be connected to the power supply wiring portion such as external battery and the load wiring portion.

The welded connection portion between the one end 38a of the core wire for the harness 37 for outside connection and the one edge 34a of this bus bar 34 is placed in the cavity portion surrounded by the projection rib 35a of the housing 35, the lid 36 and the heat radiating plate 46. The resin material 44 having high heat conductivity is filled into this cavity portion. Whereby, the harness 37 for outside connection welded with one edge 34a of the bus bar 34 is molded of resin and has a stronger holding power and the heating of the welded portion due to supply of large electric power can be radiated via the resin material 44 to the heat radiating plate 46. Since the electronic apparatus is connected to the external battery without using the connector, it is possible to prevent a current loss in the connector portion when supplying large current.

Referring to FIG. 5, a procedure for the wiring connection method of the wiring connection structure 30 for connecting the electronic apparatus to the outside will be described below.

FIG. 5 is an explanatory cross-sectional view showing the steps of the wiring connection method for connecting the wiring of the electronic apparatus to the outside according to the second embodiment of the invention. FIG. 5A shows a step of welding the bus bar and the harness. FIG. 5B shows a step of placing the bus bar in the housing in a state where the bus bar and the harness are welded. FIG. 5C shows a step of insert molding the bus bar and the harness into the housing by filling resin into the housing. FIG. 5D shows a step of mounting the electric circuit substrate portion in the housing, soldering the bus bar with the circuit pattern of the electric circuit substrate portion, and pouring and molding the resin into the welded connection portion between the bus bar and the harness.

Figure 5A:
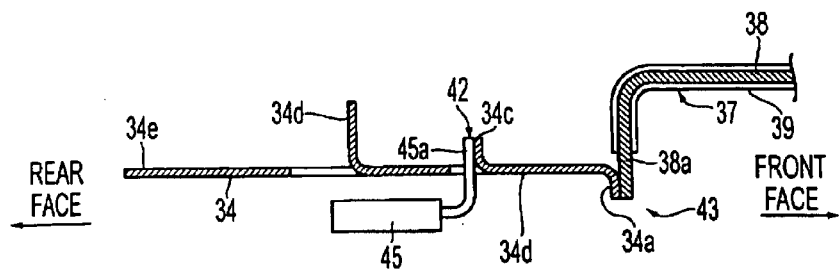
FIG. 5 is an explanatory cross-sectional view showing the steps of a wiring connection method for connecting the wiring of the electronic apparatus to the outside according to the second embodiment of the invention.

In the step of welding the bus bar 34 and the harness 37, several harnesses 37 for outside connection having a certain length (e.g., length from a position of one edge 34a of the bus bar 34 provided in the electric circuit substrate portion 31 including the control circuit to a position of the power supply wiring portion such as an external battery, or to a position of the load wiring portion) are connected with the bus bar 34 by ultrasonic welding or resistance welding, as shown in FIG. 5A.

For this connection, the core wire 38 for the harness 37 for outside connection from which the jacket 39 is removed by a predetermined length is contacted and welded with the one edge 34a of the bus bar 34. Also, the lead wire 45a of the electrical part 45 having large heat capacity is soldered with the projection portion 42 of the terminal 34c of this bus bar 34.

Figure 5B:
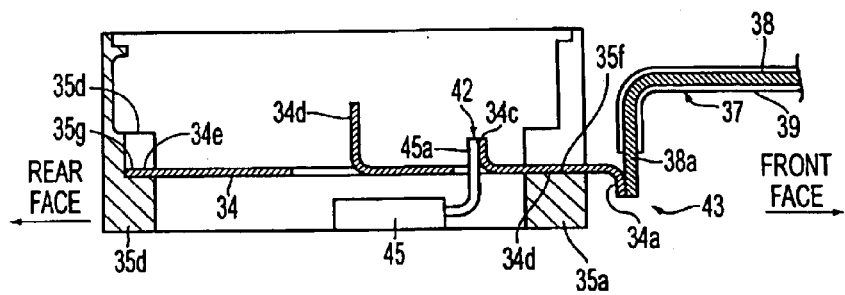

In the step of placing the bus bar 34 in the housing 35 in a state where the bus bar 34 and the harness 37 are joined, the bus bar 34 is disposed in the housing 35 while the welded connection portion between the bus bar 34 and the harness 37 protrudes from the projection rib 35a of the housing 15, as shown in FIG. 5B. This is performed by placing the rear end portion 34e of the bus bar 34 in a notch portion 35g of the projection rib 35b provided in the rear frame portion of the housing 35 and placing the portion 34d of the bus bar 34 spaced a certain length from the front end portion 34a toward the rear face side in a notch portion 35f of the projection rib 35a provided in the front frame portion of the housing 35.

Figure 5C:
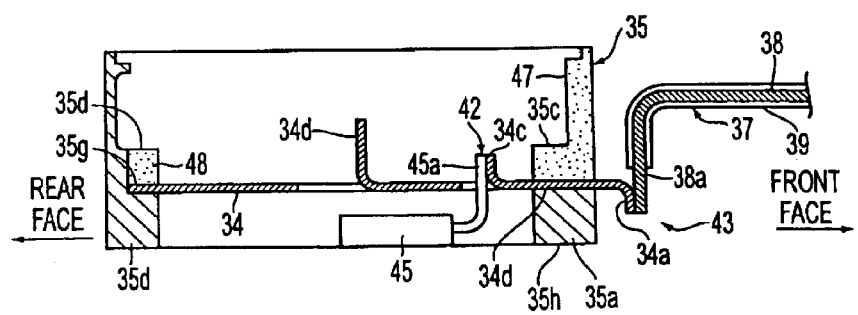

Next, in the step of insert molding the bus bar 34 and the harness 37 into the housing 35 by filling resin into the housing 35, the bus bar 34 and the harness 37 are insert molded into the housing 35 by filling resin into a placement portion of the housing 35 where the bus bar 34 and the harness 37 are disposed, as shown in FIG. 5C. This is performed by filling a resin material 48 into the rear end portion 34e of the bus bar 34 disposed in the notch portion 35g of the projection rib 35b provided in the rear frame portion of the housing 35, and filling a resin material 47 into the portion 34d of the bus bar 34 spaced a certain length from the front end portion 34a.

Figure 5D:
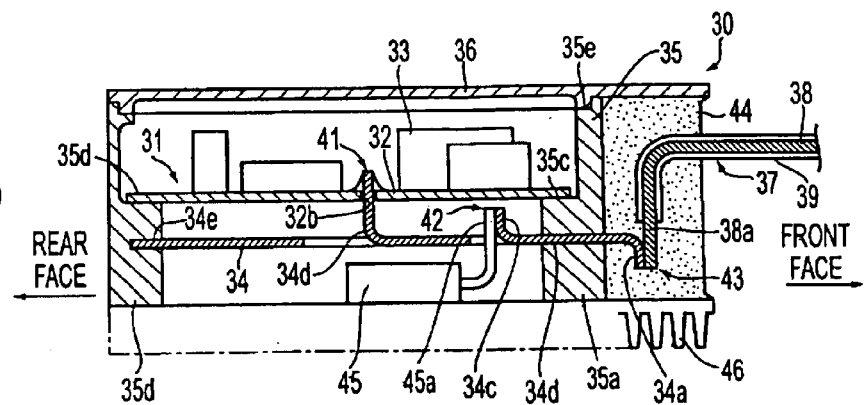

Lastly, in the step of mounting the electric circuit substrate portion 31 in the housing 35 and soldering the bus bar 34 with the circuit pattern of the electric circuit substrate portion 31 and the step of pouring and molding the resin material into the welded connection portion between the bus bar 34 and the harness 37, the heat radiating plate 46 is installed on the rear face side 35h of the housing 35, into which the bus bar 34 welded with the harness 37 for outside connection is insert molded, and the electric circuit substrate portion 31 is mounted on the upper faces 35c and 35d of the projection ribs 35a and 35b in the housing 35, as shown in FIG. 5D.

When installing this heat radiating plate 46 on the rear face 35h of the housing 35, the electric part having large heat capacity soldered with the bus bar 34 is attached on the inner face of the heat radiating plate 46 using an attaching screw (not shown), after the heat radiating plate 46 is fixed onto the housing 35. At the time of mounting the electric circuit substrate portion 31 in the housing 35, the end portion 34b of the bus bar 34 is inserted into the bore 32b having the land of the board 32 and the electric circuit substrate portion 31 is attached on the housing 35 using an attaching screw (not shown). The projection portion 41 at the terminal 34b of the bus bar 14 inserted into the bore 32b having the land of the board 32 and the land of the board 32 are soldered. This step of soldering the terminal 34b of the bus bar 34 and the land of the board 32 may be made at the time of joining the bus bar 34 and the harness 37 for outside connection before placing the bus bar 34 and the harness 37 for outside connection in the housing 35.

Then, the lid 36 is put on the housing 35 having the electric circuit substrate portion 31 mounted. The resin material 44 having high heat conductivity is poured and molded into the welded connection portion between the one edge 34a of the bus bar 34 disposed in the cavity portion surrounded by the projection rib 35a of the housing 35, the lid 36 and the heat radiating plate 46 and the core wire portion 38a of the harness 37 for outside connection.

The harness 37 for outside connection disposed in this electronic apparatus is connected to the power supply wiring portion such as an external battery (e.g., connected to a connector or a terminal portion of the battery) and the load wiring portion (e.g., a wiring portion on the board making up a load circuit or a load circuit connector).

In the case where the cavity portion into which the resin material 44 is filled is formed by providing the projection portions on the upper and lower faces of the projection rib 35a in the housing 35, and molding the front frame portion having a cross section of the U-character shape, the step of pouring the resin material 44 having high heat conductivity into the cavity portion may be made in the step of insert molding the bus bar welded with the harness into the housing by filling the resin in the housing, as shown in FIG. 5C. In the second embodiment of the invention, the bus bar 34 is insert molded into the housing 35 in a state where the one edge 34a of the bus bar 34 and the core wire 38 of the harness 37 for outside connection are welded and the welded connection portion between the one edge 34a of the bus bar 34 and the core wire 38 of the harness 37 for outside connection is molded of the resin material 44. Alternatively, the bus bar 34 may be insert molded into the housing 35, and then one edge 34a of the bus bar 34 and the core wire 38 of the harness 37 for outside connection may be soldered, whereby the welded connection portion between the one edge 34a of the bus bar 34 and the core wire 38 of the harness 37 for outside connection may be molded of the resin material 44. Also, in the second embodiment of the invention, the bus bar 34 welded with the core wire 38 of the harness 37 for outside connection is insert molded into the housing 35 and then the welded connection portion is molded of the resin material 44. Alternatively, the bus bar 34 and the welded connection portion may be insert molded into the housing 35 in the same step so that the resin material 44 and the projection rib 35a of the housing 35 may be integrated.

As described above, in the wiring connection method and the wiring connection structure 30 for connecting the electronic apparatus to the outside according to the second embodiment of this invention, the bus bar 34 used to supply a large current and the harness 37 for outside connection are welded and the bus bar 34 is insert molded into the housing 35 for the electronic apparatus in a state where they are joined to each other, and the harness 37 for outside connection welded with the bus bar 34 is molded of the resin material 44 having high heat conductivity. Whereby the wiring of the electric circuit substrate portion 31 having electric circuits including a control circuit, which is soldered to the bus bar 34, to the outside can be directly connected via the harness 37 for outside connection to the power supply wiring portion such as an external battery and the load wiring portion without the use of any connector. Hence, number of parts such as a connector can be reduced. Since the bus bar 34 and the harness 37 for outside connection are joined before being accommodated within the housing 35, number of steps for soldering the connector pin and the bus bar can be reduced.

Since the welded portion between the harness 37 for outside connection and the bus bar 34 is molded of the resin material 44 having high heat conductivity, the heat generated in the welded connection portion between the harness 37 for outside connection and the bus bar 34 due to a large current applied can be diffused via the resin material 44 to the heat radiating plate 46, and the harness 37 for outside connection has a stronger holding power.

A wiring connection structure 50 for connecting an electronic apparatus to the outside according to a third embodiment of the invention will be described below with reference to the accompanying drawings.

Figure 6A:
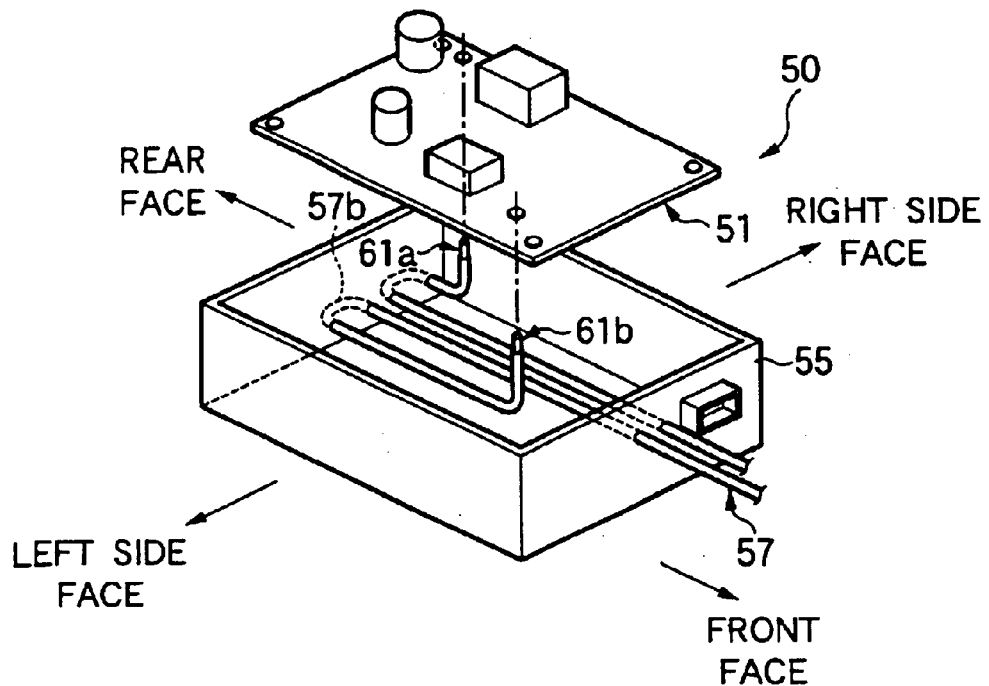
FIG. 6 is a cross-sectional view showing a wiring connection structure for connecting the wiring of an electronic apparatus to the outside according to a third embodiment of the invention.
Figure 6B:
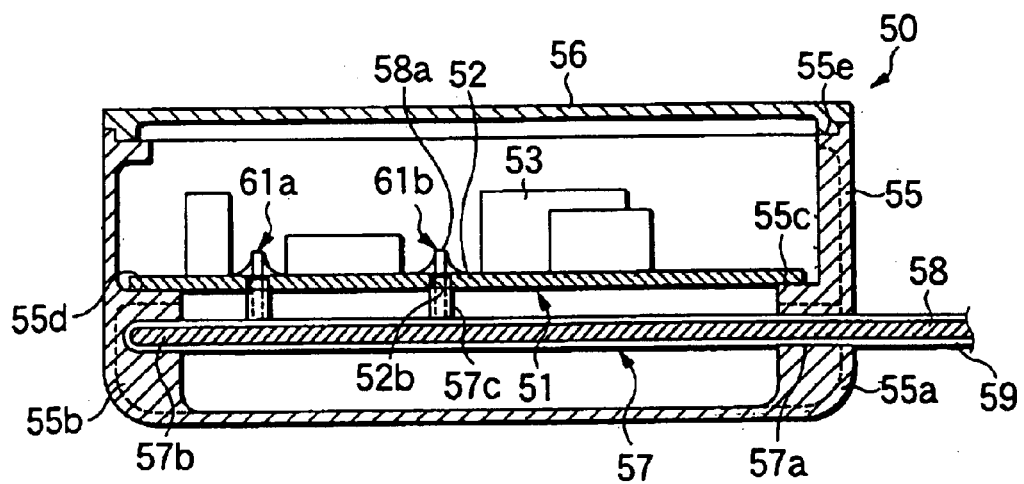
Figure 7:
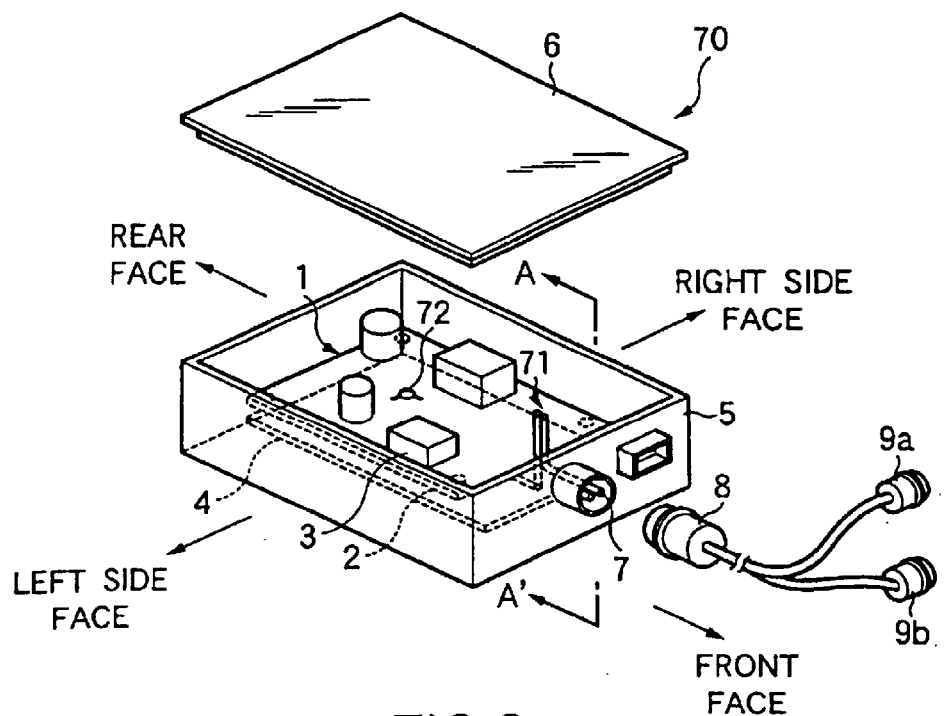
FIG. 7 is an appearance view showing a wiring connection structure according to the related art for connecting the wiring of an electronic apparatus to the outside.

FIG. 6 is a cross-sectional view showing the wiring connection structure for connecting the wiring of the electronic apparatus to the outside according to the third embodiment of the invention. FIG. 6A is a perspective view, partly in cross section, and FIG. 6B is a cross-sectional view.

Figure 8:
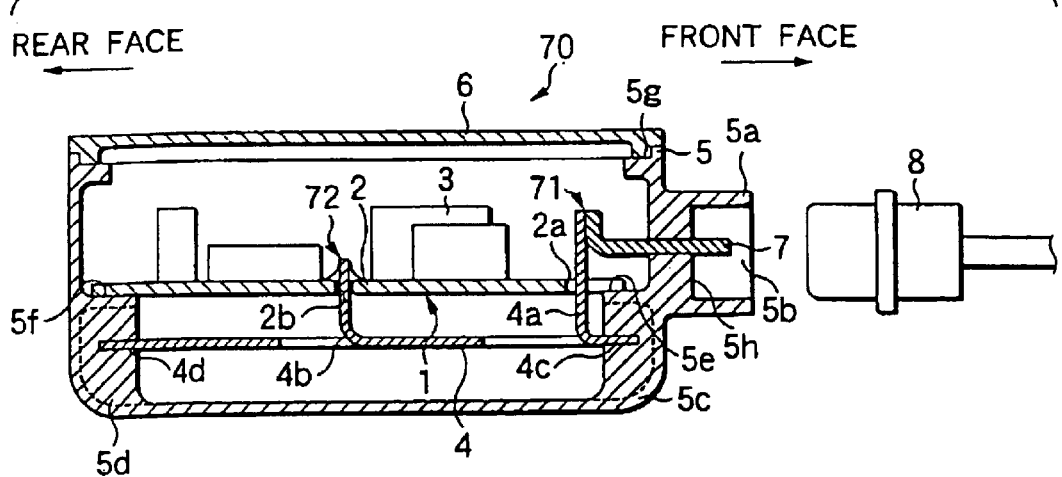
FIG. 8 is a cross-sectional view showing the wiring connection structure according to the related art for connecting the wiring of the electronic apparatus to the outside, taken along line A-A' in FIG. 7.

The wiring connection structure 50 for connecting the electronic apparatus to the outside according to the third embodiment of the invention, in contrast to the first embodiment of the invention, includes a harness 57 for outside connection formed of a core wire 58 made of metal wire rod such as copper wire having a jacket 59 made of an insulating material to supply a large current within the housing, without using a bus bar, in which the harness 57 for outside connection is laid to face connection with an electric circuit substrate portion 51 and directly insert molded into a front frame portion 55a and a rear frame portion 55b in the housing 55, as shown in FIG. 8. This insert molding is made by disposing a rear face end portion 57b of the harness 57 for outside connection within the rear frame portion 55b and placing a front lead-out portion 57a of the harness 57 for outside connection to penetrate through the front frame portion 55a, in which one end of the harness 57 for outside connection insert molded into the housing 55 is soldered with a terminal of the electric circuit substrate portion 51. Accordingly, only a different point from the first embodiment of the invention will be described. The different point includes injection molding the harness 57 for outside connection into the housing 55. The description of other points is omitted.

The housing 55 is formed of resin material such as ABS resin and shaped like a box, in which the harness 57 for outside connection formed of a metal wire rod such as copper wire having the jacket made of an insulating material is insert molded into the housing 55. Within this housing 55, the electric circuit substrate portion 51 is mounted, and a lid 56 formed of resin material is attached on the upper face sideof the housing 55.

The projection ribs 55a and 55b are provided on the inner faces of the front frame portion 55a and the rear frame portion 55b for this housing 55, respectively. The harness 57 for outside connection is insert molded in such a manner that within a projection rib 55a of this front frame portion, a front face lead-out portion 57a of the harness 57 for outside connection is disposed to penetrate through the projection rib 55a in a state where the jacket 59 covers the core wire 58, and a rear face end portion 57b of the harness 57 for outside connection is disposed within a projection rib 55b. The planes for mounting the electric circuit substrate portion 51 are provided on the upper faces 55c and 55d of the projection ribs 55a and 55b in the housing 55, and a planar portion 55e for being attached the lid 56 formed of resin material to is molded on an upper face portion with opening in the housing 55.

After the electric circuit substrate portion 51 is mounted within the housing 55, the land of the board 52 is soldered with one end 58a of the core wire 58 for the harness 57 for outside connection, whereby the electric circuit wiring of the electric circuit substrate portion 51 having electric circuits including a control circuit are directly connected via the harness 57 for outside connection to a power supply wiring portion (not shown) such as an external battery and a load wiring portion (not shown).

The harness 57 for outside connection has the jacket 59 of insulating material covering the core wire 58 such as copper wire, and is used to make the electrical connections, particularly to connect the electric circuit wiring of the electric circuit substrate portion 51 having electric circuits including a control circuit via the harness 57 for outside connection to the power supply wiring portion (not shown) such as an external battery and the load wiring portion (not shown), to supply a large current to the electric circuit substrate portion 51.

This harness 57 for outside connection has the front face lead-out portion 57a of the harness 57 for outside connection disposed to penetrate through the projection rib 55a of the housing 55 in a state where the jacket 59 covers the core wire 58 and the rear face end portion 57b of the harness 57 for outside connection placed within the projection rib 55b of the housing 55. In the above described state, the harness 57 is insert molded. The harness 57 for outside connection insert molded into this housing 55 is laid a certain length from the front face lead-out portion 57a and connected to the power supply wiring portion such as external battery and the load wiring portion.

For this harness 57 for outside connection, after the electric circuit substrate portion 51 is mounted in the housing 55, one end of the harness 57 is bent in a direction against the electric circuit substrate portion 51, the core wire 58a from which the jacket 59 is removed by a certain length is inserted into the bore 52b having the land on the electric circuit substrate portion 51 to project from the electric circuit substrate portion 51, in which the core wire 58a of the projecting portions 61b and 61a is soldered with the land, and the power supply wiring is connected to the land of the board 52, directly using the harness 57. Whereby, the harness 57 for outside connection is insert molded into the housing 55 with a stronger holding power, and can be directly connected to the external battery without the use of any bus bar and any connector, it is possible to prevent a current loss in the bus bar and the connector portion when supplying large current, and enhance the quality.

Next, a procedure for the wiring connection method of the wiring connection structure 50 for the electronic apparatus to the outside will be described below. Several harnesses 57 for outside connection having a certain length (e.g., length from a position of the electric circuit substrate portion 51 including the control circuit to a position of the power supply wiring portion such as an external battery, or to a position of the load wiring portion) are insert molded into the housing 55. In this insert molding, the front face lead-out portion 57a of the harness 57 for outside connection is disposed to penetrate through the projection rib 55a of the housing 55 in a state where the jacket 59 covers the core wire 58 and the rear face end portion 57b of the harness 57 for outside connection is disposed within the projection rib 55b of the housing 55. After the electric circuit substrate portion 51 is mounted on the upper faces 55c and 55d of the projection ribs 55a and 55b in the housing 55, one end of the harness 57 is bend in a direction against the electric circuit substrate portion 51, and the core wire 58a from which the jacket 59 is removed a predetermined length is inserted into the bore 52b having the land on the electric circuit substrate portion 51 to project from the electric circuit substrate portion 51. Whereby the core wire 58a of the projecting portions 61*b* and 61*a* is soldered with the land. The lid 56 is put on the housing 55, and an electric apparatus of closed structure, for example, is assembled. Also, the harness 57 for outside connection insert molded into this housing 55 is laid a certain length from the front face lead-out portion 57*a*, and connected to the power supply wiring portion such as external battery and the load wiring portion.

As described above, in the wiring connection method and the wiring connection structure 50 for connecting the electronic apparatus to the outside according to the third embodiment of the invention, the harness 57 for outside connection is directly insert molded into the housing 55, without providing the bus bar to supply large current, one end of the harness 57 for outside connection within the housing 55 being soldered to the terminal of the electric circuit substrate portion 51, and the harness 57 for outside connection is connected to the power supply wiring portion such as external battery and the load wiring portion, whereby the number of parts such as bus bar and connector can be reduced, and no step for soldering the bus bar and the connector pin is required, because of no use of the bus bar, resulting in lower costs. Moreover, it is possible to prevent a current loss due to the bus bar and the connector portion when supplying large current, and enhance the quality. Since the harness 57 for outside connection is insert molded into the housing 55, the harness 57 for outside connection has a stronger holding power.

As described above, with the present invention, the number of joining steps can be reduced by joining the bus bar and the harness before accommodating them within the housing. Also, the costs can be cut back by removing the wiring connection between the connector and the bus bar without using the connector. A current loss due to the connector portion is prevented even if a large current is applied, and the heating at the junction portion with the connector is diffused, whereby the quality can be improved.

What is claimed is:

1. A wiring connection method comprising the steps of:
  connecting a bus bar for wiring inside an electronic apparatus and a harness for leading out wiring to outside;
  placing the bus bar and the harness connected together on a notch portion of a housing; and
  filling the notch portion with a resin to fix the harness in the notch portion of the housing.

2. The wiring connecting method according to claim 1, wherein in the placing step, a connection portion between the bus bar and the harness is placed in a portion to be filled with the resin.

3. The wiring connecting method according to claim 1, wherein in the filling step, a connection portion between the bus bar and the harness is covered with the resin.

4. The wiring connecting method according to claim 2, further comprising the steps of disposing a heat sink to contact with a portion filled with the resin.

5. The wiring connecting method according to claim 1, further comprising the steps of soldering the bus bar with an electric circuit board.

6. A wiring connection method comprising the steps of:
  connecting a bus bar for wiring inside an electronic apparatus and a harness for leading out wiring to outside;
  placing the bus bar and the harness on a notch portion of a housing so that a connecting portion between the bus bar and the harness is exposed outside the housing;
  filling a resin to fix the bus bar in the notch portion of the housing to insert-mold the bus bar into the housing; and
  covering the connection portion between the bus bar and the harness exposed from the housing with a thermal conductive resin.

7. A wiring connection method comprising the steps of:
  placing a bus bar on a notch portion of a housing so that a top end portion of the bus bar for wiring inside an electronic apparatus is exposed outside the housing;
  filling a resin to fix the bus bar in the notch portion of the housing to insert-mold the bus bar into the housing;
  connecting a harness with the bus bar at the outside of the housing; and
  covering a connection portion between the bus bar and the harness exposed from the housing with a thermal conductive resin,
  wherein the placing step is conducted prior to the connecting step.

\* \* \* \* \*